(12) United States Patent
Fujikawa et al.

(10) Patent No.: US 9,933,140 B2
(45) Date of Patent: Apr. 3, 2018

(54) LIGHT EMITTING DEVICE

(71) Applicant: NICHIA CORPORATION, Anan-shi, Tokushima (JP)

(72) Inventors: Yasuo Fujikawa, Yokohama (JP); Takuya Wasa, Kaifu-gun (JP); Tomohiro Ikeda, Komatsushima (JP); Yohei Inayoshi, Komatsushima (JP); Motokazu Yamada, Tokushima (JP)

(73) Assignee: NICHIA CORPORATION, Anan-Shi (JP)

(*) Notice: Subject to any disclaimer, the term of this patent is extended or adjusted under 35 U.S.C. 154(b) by 33 days.

(21) Appl. No.: 15/054,588

(22) Filed: Feb. 26, 2016

(65) Prior Publication Data
US 2016/0252218 A1 Sep. 1, 2016

(30) Foreign Application Priority Data
Feb. 27, 2015 (JP) .................... 2015-038645

(51) Int. Cl.
F21V 11/00 (2015.01)
F21V 19/00 (2006.01)
H01L 25/075 (2006.01)
G02F 1/1335 (2006.01)
F21Y 113/00 (2016.01)
F21Y 105/16 (2016.01)
(Continued)

(52) U.S. Cl.
CPC .......... *F21V 19/005* (2013.01); *G02F 1/1336* (2013.01); *H01L 25/0753* (2013.01); *F21Y 2103/10* (2016.08); *F21Y 2105/16* (2016.08); *F21Y 2113/00* (2013.01); *F21Y 2115/10* (2016.08); *H05K 1/189* (2013.01); *H05K 2201/10106* (2013.01)

(58) Field of Classification Search
CPC .. G02B 6/0055; G02B 6/0031; G02B 6/0068; G02F 1/133603
USPC ................ 362/97.1, 235, 609, 84, 341, 241
See application file for complete search history.

(56) References Cited

U.S. PATENT DOCUMENTS

2006/0245208 A1 11/2006 Sakamoto et al.
2009/0303411 A1 12/2009 Kawato et al.
(Continued)

FOREIGN PATENT DOCUMENTS

JP 2006-332024 A 12/2006
JP 2008-003254 A 1/2008
(Continued)

Primary Examiner — Jamara Franklin
(74) Attorney, Agent, or Firm — Foley & Lardner LLP

(57) ABSTRACT

A light emitting device includes a plurality of oblong flexible substrates, each flexible substrate comprising a sheet-shaped base body and a wiring pattern formed on one face of the base body, and each flexible substrate having a plurality of light emitting sections disposed thereon; a plurality of a reflective layers, each reflective layer being disposed at a periphery of a respective light emitting section above a respective flexible substrate; an insulating reflective sheet made of a light reflecting resin, the reflective sheet having a plurality of through holes located such that the light emitting sections and at least a portion of the reflective layers are exposed via the through holes; and a plurality of adhesive members, each adhesive member adhering a respective flexible substrate to the reflective sheet in regions where the reflective layer is not formed.

17 Claims, 16 Drawing Sheets

(51) Int. Cl.
   *F21Y 103/10*   (2016.01)
   *F21Y 115/10*   (2016.01)
   *H05K 1/18*     (2006.01)

(56) References Cited

U.S. PATENT DOCUMENTS

| | | | |
|---|---|---|---|
| 2010/0265694 A1* | 10/2010 | Kim | G02B 6/0021 |
| | | | 362/97.1 |
| 2011/0096265 A1 | 4/2011 | Murakoshi et al. | |
| 2012/0044668 A1 | 2/2012 | Takeuchi | |
| 2012/0243255 A1 | 9/2012 | Yamamoto | |

FOREIGN PATENT DOCUMENTS

| | | |
|---|---|---|
| JP | 2008-227423 A | 9/2008 |
| JP | 2009-289687 A | 12/2009 |
| JP | 2010-278016 A | 12/2010 |
| JP | 2010-278426 A | 12/2010 |
| JP | 2011-090977 A | 5/2011 |
| JP | 2011-165434 A | 8/2011 |
| JP | 2012-203997 A | 10/2012 |
| JP | 2013-037870 A | 2/2013 |
| JP | 2013-152865 A | 8/2013 |
| JP | 2014-131084 A | 7/2014 |
| JP | 2014-167495 A | 9/2014 |
| WO | WO-2007/037035 A1 | 4/2007 |
| WO | WO-2012/029686 A1 | 3/2012 |

\* cited by examiner

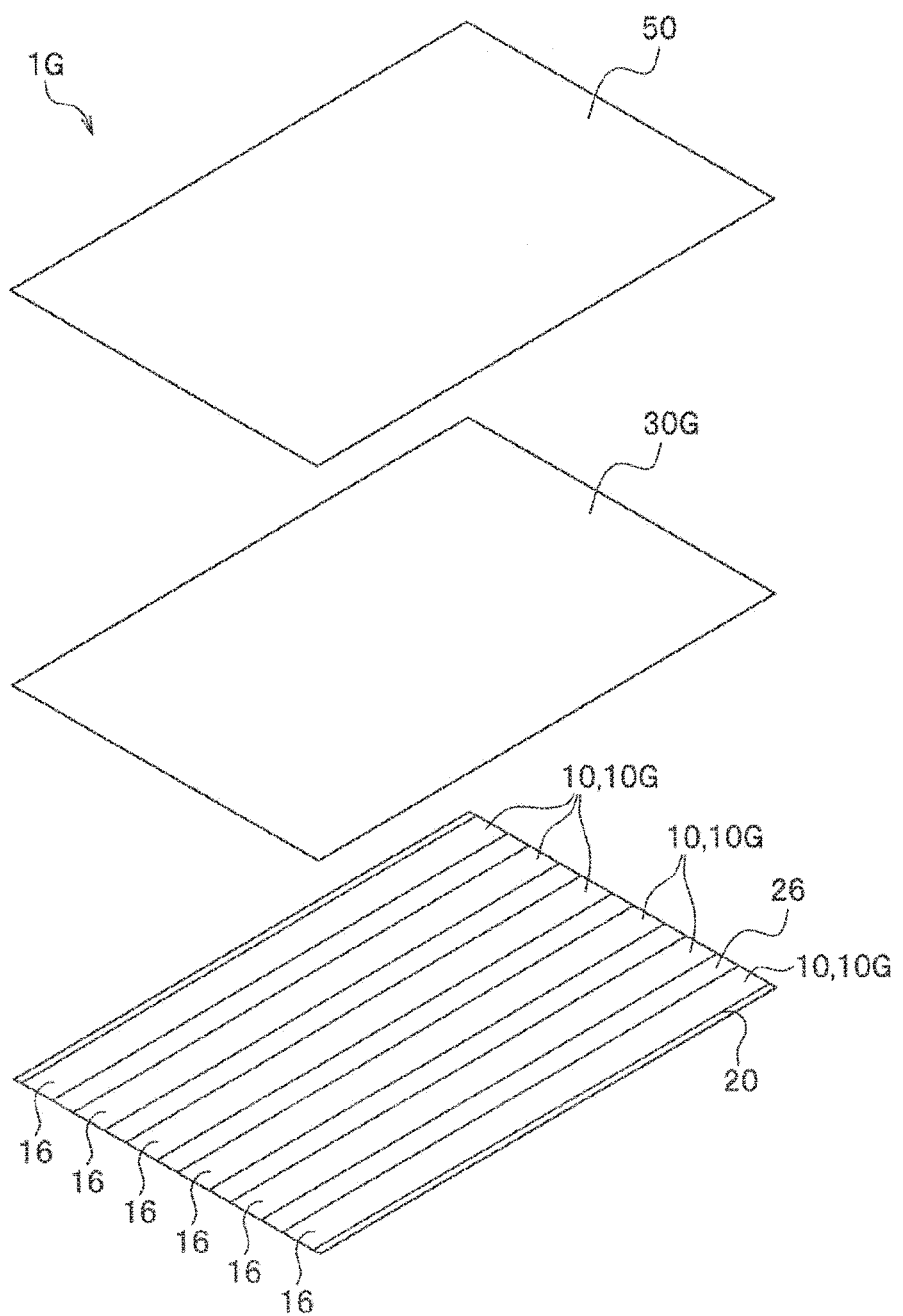

LIGHT EMITTING DEVICE

CROSS-REFERENCE TO RELATED APPLICATIONS

The present application claims priority under 35 U.S.C. § 119 to Japanese Patent Application No. 2015-038645 filed Feb. 27, 2015, the contents of which are incorporated herein by reference in their entirety.

BACKGROUND

The present disclosure relates to a light emitting device that includes a flexible substrate.

A light emitting device employing a flexible substrate that includes a reflective film covering a wiring pattern disposed on the sheet base material has been proposed. For example, Japanese Unexamined Patent Application Publication No. 2014-131084 (Patent Document 1) discloses, as an example of the reflective film, an insulating white ink referred to as a white resist made of a silicone-based resin containing a titanium oxide.

Japanese Unexamined Patent Application Publication No. 2010-278016 (Patent Document 2) discloses an electronic device constructed by securing an LED substrate to a metal sheet support using substrate holders, the LED substrate having a plurality of LEDs mounted on one face and a reflective sheet made of a synthetic resin having through holes at the positions corresponding to the LEDs.

SUMMARY

The light emitting device according to one embodiment comprises a plurality of oblong flexible substrates each including a wiring pattern disposed on one face of a sheet-shaped base body, light emitting sections disposed on the flexible substrates, a reflective layer disposed at the peripheries of said light emitting sections directly on the wiring pattern or spaced apart from said wiring patterns in the stacking direction on the flexible substrates, an insulating reflective sheet made of a light reflecting resin including through holes so as to expose the light emitting sections and at least one portion of the reflective layer, and an insulating adhesive member adhering the flexible substrates to the reflective sheet in the regions where said reflective layer is not formed.

BRIEF DESCRIPTION OF THE DRAWINGS

FIG. 12 is a schematic exploded perspective view of the light emitting device according to Embodiment 6 viewed from the side opposite the emission surface.

DESCRIPTION

Figure 1:
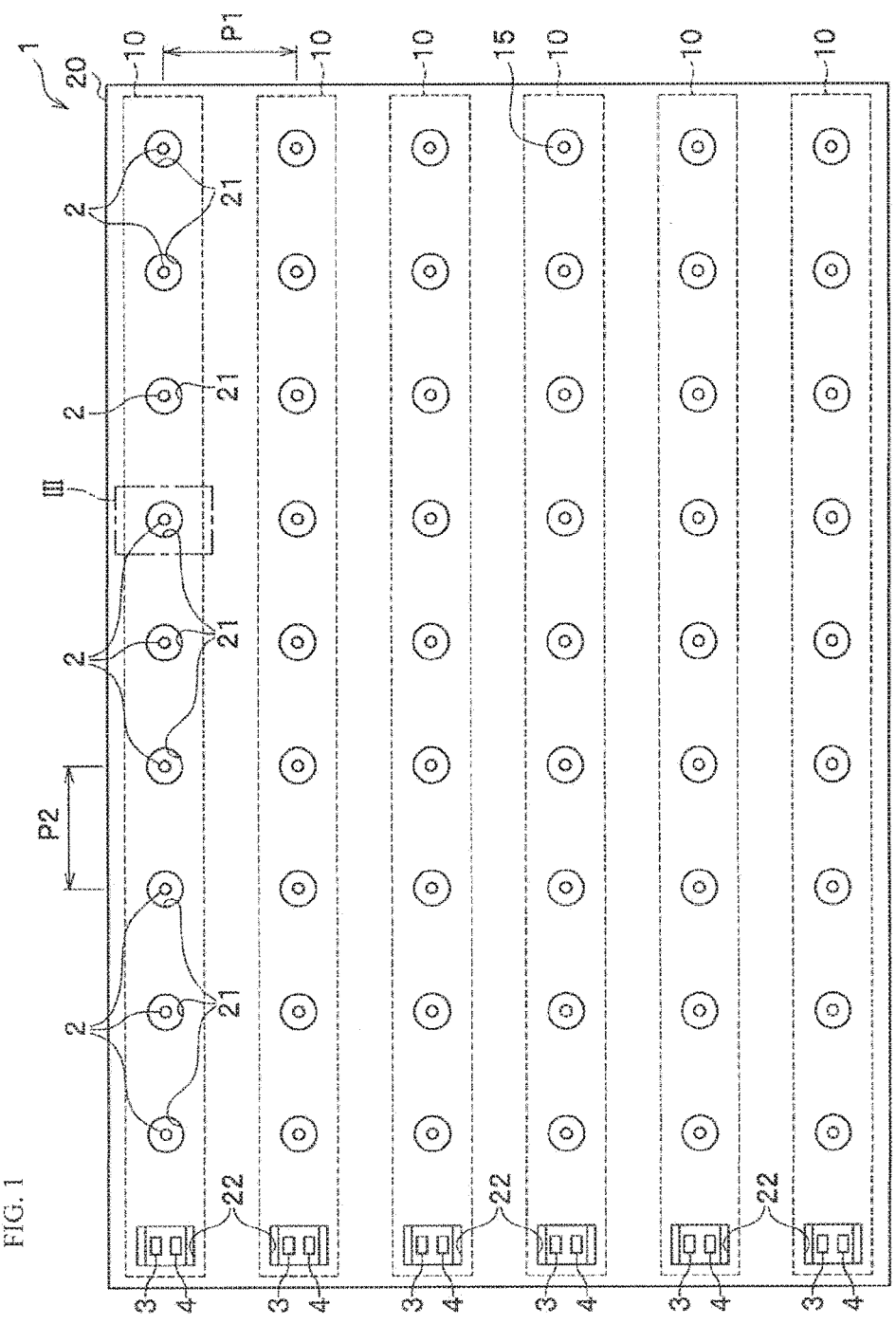
FIG. 1 is a schematic plan view of the light emitting device according to Embodiment 1.

Embodiments of the invention will be described below with reference to the drawings. The following embodiments, however, exemplify the light emitting devices for the purpose of embodying the technical concepts of the invention, and do not limit the invention. The dimensions, materials, and shapes of the constituent elements, as well as the relative positioning thereof, described in the embodiments are offered to merely as examples, and are not intended to limit the scope of the invention to those described unless otherwise specifically noted. The sizes of the components, their positional relationship, or the like, shown in the drawings might be exaggerated for clarity of explanations.

Embodiment 1

Figure 2:
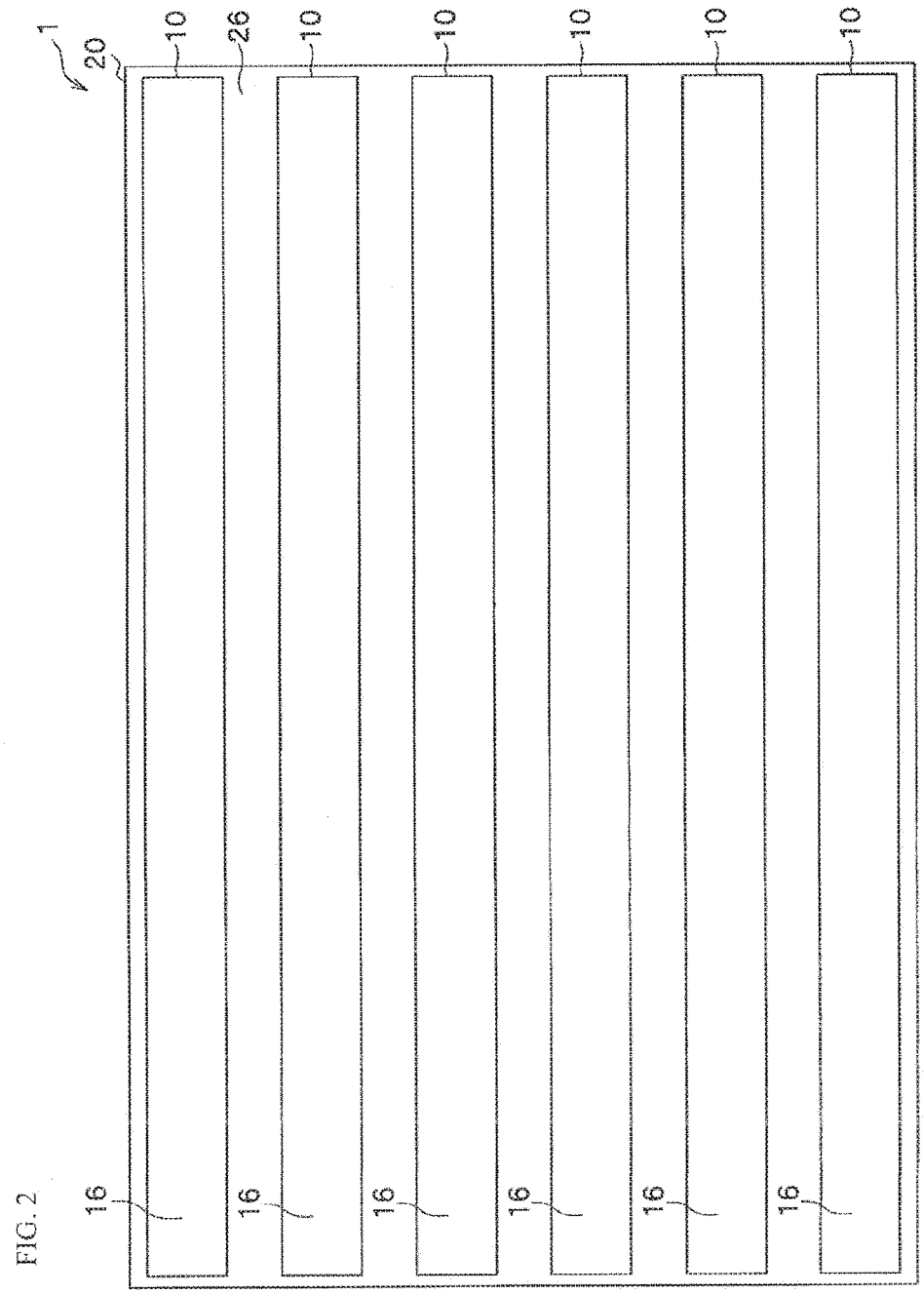
FIG. 2 is a schematic bottom view of the light emitting device according to Embodiment 1.
Figure 4:
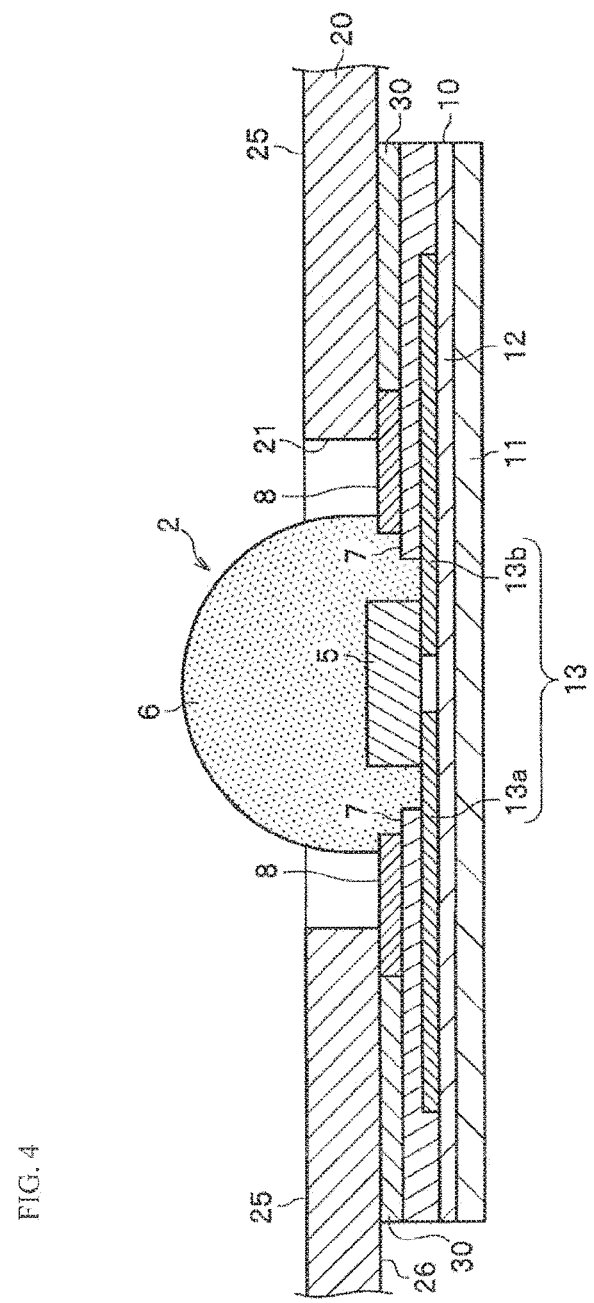
FIG. 4 is a schematic cross-sectional view of the light emitting device according to Embodiment 1 viewed in the direction indicated by arrows IV-IV in FIG. 3.

As shown in FIGS. 1 and 4, the light emitting device 1 according to Embodiment 1 includes a plurality of oblong flexible substrates 10 (hereinafter referred to as flexible substrates 10), reflective sheet 20, and adhesive members 30. A plurality of light emitting sections 2 and a reflective layer 8 are disposed at the peripheries of the light emitting sections 2 on the flexible substrates 10. As shown in FIG. 1, the light emitting device 1 is provided with a plurality of flexible substrates 10 (six shown here) disposed at a certain pitch P1 along the direction perpendicular to the longitudinal direction of the flexible substrates. Each flexible substrate 10 is provided with a plurality of light emitting sections 2 (nine shown here) disposed at a certain pitch P2 along the longitudinal direction of the substrate. As shown FIG. 1, at one end of the upper faces 15 of the flexible substrates 10 (the left end in FIG. 1), connectors 3 and 4 are mounted for electrically connecting an external power supply to a wiring pattern 13 shown FIG. 4 via a wire harness, for example. The reflective sheet 20 has through holes 21 so as to expose the light emitting sections 2 and at least one portion of the reflective layers 8. The reflective sheet 20 also has through holes 22 to expose the connectors 3 and 4. The upper faces 15 of the flexible substrates 10 are adhered to the rear face 26 of the reflective sheet 20 shown FIG. 2 via the adhesive members 30 shown FIG. 4. The light reflecting surface (the face of the opposite to the rear face) of the reflective sheet 20 may be referred to as the front face 25 hereinafter.

By disposing the insulating reflective film on the wiring pattern, the light emitting device 1 can reduce electric shocks when the device is powered, and protect against static electricity when the device is handled, as well as improving the light reflectance of the substrate surface. The use of the white resist as a reflective film, however, may be costly, and there may be a need for further cost reduction.

By including the reflective sheet, the light emitting device disclosed in Patent Document 2 can reflect the LED light. However, the LED substrate and the reflective sheet are secured to the support using substrate holders, which may make it difficult to produce a flexible light emitting device.

An object of certain embodiments of the present invention is to provide a low-cost bendable light emitting device.

According to the light emitting devices of certain embodiments, a bendable light emitting device can be produced at low cost by adhering flexible substrates to a reflective sheet.

Flexible Substrate

The flexible substrates 10 are disposed on the reflective sheet 20 with light emitting elements 5 shown in FIG. 4 and other components mounted thereon. The pitch P1 between the flexible substrates 10 is set larger than the width of a flexible substrate 10. The flexible substrates 10 can be flexible printed boards having a wiring pattern on at least one face of a sheet-shaped base body 11.

Each flexible substrate 10, as shown in FIG. 4, has a region where the base body 11 and the wiring member 13 (wiring pattern) are stacked in that order. On the wiring pattern 13, a region where an underlayer 7, which be used as a base for the reflective layer 8, alone is stacked, and a region where both the underlayer 7 and the reflective layer 8 are stacked. An adhesive layer 12 may be disposed between the base body 11 and the wiring pattern 13. In the explanation below, the face of a flexible substrate 10 on which the wiring pattern 13 is formed may be referred to as the upper face 15 (see FIG. 1), and the face on the base body 11 side may be referred to as the back face 16 (see FIG. 2).

The base body 11 is the base of the flexible substrate 10, and is made of a flexible insulating material. Polyimide, for example, is a suitable material for the base body 11. A molded reinforced plastic material made by pre-impregnating a fibrous material, such as glass cloth or carbon fiber fabric, with a resin (e.g., glass fiber reinforced epoxy composite, prepreg, or the like) is also suitable. A resin film, such as polyethylene terephthalate (PET), polyethylene naphthalate, polyetherimide, polyphenylene sulfide, liquid crystal polymer, or the like, may also be used. The thickness of the base body 11 is, for example, in a range between about 10 and 300 μm. The base body 11 may be of either a single layer or multilayer structure.

The adhesive layer 12 adheres the base body 11 and the wiring pattern 13. As material for the adhesive layer 12, examples include a urethane-based adhesive, or the like. The adhesive layer 12 may not be required in the case where the base body 11 is made of a material capable of directly adhering to the wiring pattern 13 such as a molded reinforced plastic material mentioned above, for example. In these cases, the wiring member 13 is formed directly on the base body 11.

The wiring pattern 13 includes a conductive material. The wiring pattern 13 is formed on the base body 11, for example, via an adhesive layer 12, which creates an electrical circuit when electrically connected to each light emitting element 5. The wiring member 13, for example, is made of a copper foil. Besides that, an aluminum foil, aluminum alloy foil, stainless steel foil, or the like, can also be employed. The thickness of the wiring pattern may be in a range between 10 μm and 50 μm.

Figure 3:
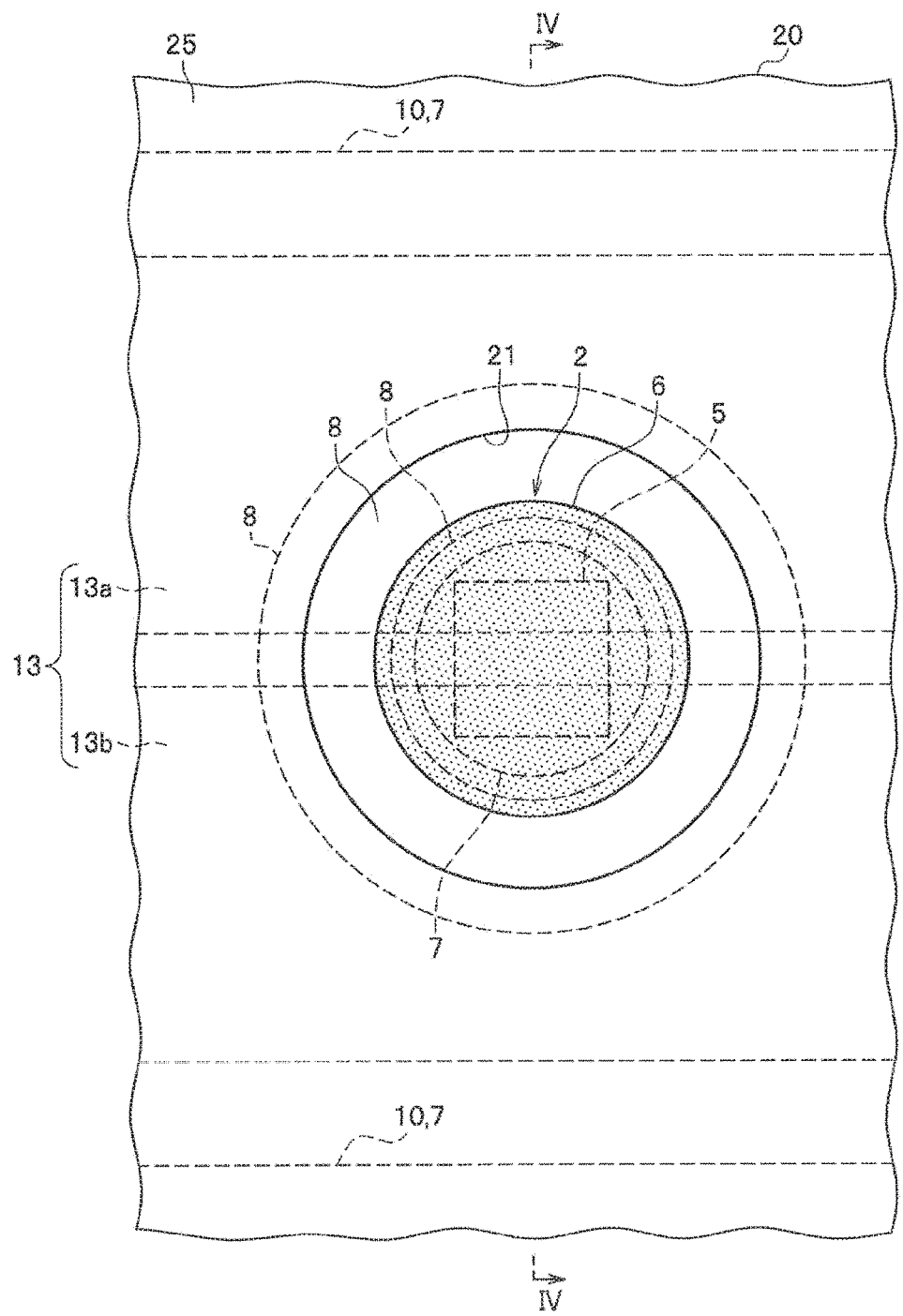
FIG. 3 is a schematic plan view of the light emitting device according to Embodiment 1 enlarging the region III indicated in FIG. 1.

As shown in FIGS. 3 and 4, a groove extending in the longitudinal direction of the flexible substrate 10 is formed between two lines of wiring member 13a and 13b which make up the wiring pattern 13 formed on the flexible substrate 10. The groove can be formed by removing the material forming the wiring pattern 13 formed on the flexible substrate 10 by etching or the like.

Figure 5:
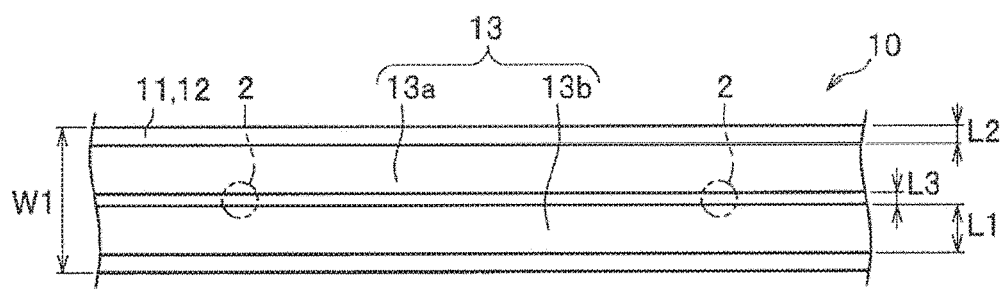
FIG. 5 is a schematic plan view of the flexible substrate of the light emitting device according to Embodiment 1, illustrating one example of the wiring member formed under the reflective layer and an underlayer.

As shown in FIG. 5, each of the two wiring members 13a and 13b is formed in a linear shape along a direction that is substantially parallel to the longitudinal direction of the flexible substrate 10. The width of the flexible substrate 10 is denoted as W1, and the width of each of the two wiring members 13a and 13b is denoted as L1. The width from an edge of each of the wiring members 13a and 13b to the outer edge of the base body 11 (hereinafter referred to as the creepage distance) is denoted as L2, and the gap between the two wiring members 13a and 13b is denoted as L3. In this case, preferably, the relationship expressed by the following formula (1) is established.

$$W1 = 2 \times L1 + 2 \times L2 + L3 \qquad \text{formula (1)}$$

The widths L1 to L3 can suitably be selected in accordance with the purpose and application. For example, in the case where the light emitting device will be installed in a backlight for a television, the widths L1, L2, and L3 can be set, for example, to 6 mm, 2 mm, and 200 μm, respectively.

As shown in FIGS. 3 and 4, each light emitting element 5 is disposed on the gap (groove) between the two wiring members 13a and 13b. Two adjacent light emitting elements 5 are disposed so that electrodes of the light emitting elements having the same polarity adjacent each other in the longitudinal direction of the flexible substrate 10 and are connected in parallel.

Light Emitting Section 2

As shown in FIGS. 3 and 4, the light emitting element 5 is electrically connected to the wiring member 13. As shown in FIG. 1, the pitch P2 for arranging the light emitting sections 2 on the flexible substrates 10 may be set larger than the width of a flexible substrate 10. The pitch P2 may be different from, or the same as, the pitch P1 described above. Here, as one example, the pitch P2 is the same as the pitch P1. The light emitting section 2s, as shown in FIGS. 3 and 4, can include the light emitting element 5 and a sealing member 6 respectively.

Light Emitting Element

The light emitting elements 5 emit light when a prescribed voltage is applied. An emission wavelength of the light emitting elements 5 can be visible, ultraviolet, or infrared light, or the like.

In the case where using the light emitting elements emit visible light, the emission color can be any of blue, green, and red light, for example.

A white light emitting element such as a blue light emitting element coated with a fluorescent material can also be used.

The semiconductor materials used in the light emitting element 5 can be any compound semiconductor, such as group III-V, group II-VI, or the like.

The light emitting elements 5 may be flip chip mounted or face-up mounted on the wiring member 13. As shown in FIGS. 3 and 4, in the case of using flip chip mounting, the p-side electrode (i.e. anode) and the n-side electrode (i.e. cathode) of each light emitting element 5 are bonded to a pair of wiring members 13a and 13b, respectively, via a pair of conductive joining material. For the conductive joining material, an Sn—Ag—Cu-based, Sn—Cu-based, or Au—Sn-based solder, Au metal bump, Ag paste, or the like, can be used.

In the case of using face-up mounting manner, each light emitting element 5 may be bonded on the base body 11 and/or the wiring member 13 by an insulating joining material, such as a resin, or any of the conductive joining materials mentioned above, and electrically connected to the wiring pattern 13 by wires. In the case where the element substrate of the light emitting element 5 is conductive, one of the electrodes is electrically connected to the wiring member 13a or 13b using any of the aforementioned conductive joining materials, while the other electrode is electrically connected to another wiring member 13a or 13b using a wire.

Sealing Member

The sealing member 6, as shown in FIGS. 3 and 4, encloses and protects the light emitting element 5. The sealing member 6 is light transmissive. The sealing member 6 may be provided on the upper face of the flexible substrate 10 so as to cover the light emitting element 5. The viscosity of the material forms the sealing member 6 can be adjusted so as to be applicable by printing or by using a dispenser, for example. The sealing member 6 can be cured by way of heat treatment or UV light irradiation. The sealing member 6 preferably has good adhesion with the flexible substrate 10 and the light emitting element 5. Also, the sealing member 6 preferably has flexibility. The emission wavelength and light distribution characteristics of the light emitting device can be adjusted by containing wavelength conversion material such as a YAG-based, TAG-based, or silicate-based phosphor, or the like in the sealing, member 6. Also, an inorganic light diffusing material, such as titanium oxide, silicon oxide, alumina, zinc oxide, fine glass powder, or the like; or an organic light diffusing material, such as acrylic, polystyrene, or the like can be contained in the sealing member 6. The sealing member 6 preferably has a convex shape from the perspective of improving light extraction efficiency as shown in FIG. 4. The shape of the sealing member 6 can be an approximate hemispherical shape, an oblong convex shape in a cross-sectional view, a circular or elliptical shape in a plan view, for example.

Connector 3 and 4

The connectors 3 and 4 are disposed in correspondence to the positive and negative polarities and disposed on the wiring pattern 13. Metal terminals such as DF59M manufactured by Hirose Electric Co., Ltd., or molded metal terminals, such as DF61 manufactured by Hirose Electric Co., Ltd., can be used as the connectors 3 and 4.

The p-side electrode of the light emitting element 5 is electrically connected to the connector 3 via the wiring member 13a, and is electrically connected to the positive terminal of an external power supply via a wire harness, for example.

The n-side electrode of the light emitting element 5 is electrically connected to the connector 4 via the wiring member 13b, and is electrically connected to the negative terminal of an external power supply via a wire harness, for example.

Examples of materials of the connectors 3 and 3 include rustproofed copper with tinning plating. Examples of methods of joining the connectors 3 and 4 with the wiring pattern 13 include reflow soldering, ultrasonic bonding, resistance welding, crimping, or the like.

Underlayer 7

The underlayer 7 is used as the base for the reflective layer 8. As shown in FIGS. 3 and 4, an underlayer 7 is disposed on the flexible substrate 10. The underlayer 7 preferably covers the wiring member 13 and/or the base body 11 or the adhesive layer 12 partially or entirely, while exposing a portion of the wiring member 13. The underlayer 7 has openings (for example, a circular shape) for exposing a pair of wiring members 13a and 13b which correspond to a pair of positive and negative polarities, and the groove between the pair of positive and negative wiring members 13a and 13b. The size of the opening is preferably formed in the minimum size required to enable the electrical connection between the light emitting element 5 and the wiring pattern 13 within the opening. The openings may have different in shape and size each other, but are preferably the same in shape and size.

The underlayer 7 can include a thermosetting resin, thermoplastic resin, or the like, for example. Specific examples include modified epoxy resin compositions, such as epoxy resin compositions, silicone resin compositions, silicone modified epoxy resins, and the like; modified silicone resin compositions, such as epoxy modified silicone resins, or the like; polyimide resin compositions, modified polyimide resin compositions; polyphtalamide (PPA); polycarbonate resins; polyphenylene sulfide (PPS); liquid crystal polymers (LCP); ABS resins; phenol resins; acrylic resins; PBT resins, or the like.

The underlayer 7 preferably contains a material that reflects the light emitted from the light emitting element 5, as well as the light whose wavelength has been converted by the wavelength conversion material. The reflectance here with respect to the light described is preferably 60% or higher, more preferably 65% or higher, or 70% or higher. Examples of such materials include light-reflecting materials. Examples of light-reflecting materials include titanium dioxide, silicon dioxide, zirconium dioxide, potassium titanate, alumina, aluminum nitride, magnesium oxide, boron nitride, mullite, niobium oxide, and various rare earth oxides (for example, yttrium oxide and gadolinium oxide). The underlayer 7 may contain additives, including fibrous fillers, such as glass fibers and wollastonite, carbon, talc, and inorganic fillers such as silicon oxide, or the like. The content of these materials can be in a range between 5 and 50 weight percent relative to the total weight of the underlayer 7.

The underlayer 7 is preferably formed in the thickness so that its upper face is lower than the upper face of the light emitting element 5. The underlayer 7 preferably has a thickness which does not undermine the flexibility of the flexible substrate 10, and can be formed, for example, in thickness of about 1 to 50 μm. The underlayer 7 can be formed on one face of the base body by printing, potting, spin coating, dipping, or the like.

Reflective Layer 8

The reflective layer 8, as shown in FIGS. 3 and 4, is disposed on the upper face of the wiring pattern 13, particularly in the vicinity of the light emitting section 2, that is the region corresponding to the through hole 21 or the opening of the reflective sheet 20, to increase the light extraction efficiency of the light emitting device 1. In this embodiment, the reflective layer 8 is formed in an annular shape in a plan view, disposed over the flexible substrate 10 spaced apart from the wiring pattern 13 in the stacking direction by the interposed underlayer 7.

The reflective layer 8 is preferably disposed, for example, in the form of islands (that is, a plurality of separated reflective layers are disposed) in correspondence with the quantity of the light emitting elements 5 disposed on the flexible substrates 10. The reflective layer 8 is preferably formed as islands that are separated from one another. For example, The reflective layer 8 formed as islands may be separated based on the configuration of the light emitting section 2, or based on the number of light emitting sections 2.

As shown in FIGS. 3 and 4, an edge of the reflective layer 8 on the light emitting section 2 side (that is, an edge facing the opening) is preferably more distant from the light emitting section 2 than the edge of the underlayer 7 on the light emitting section 2 side. In this case, the distance between the edge of the reflective layer 8 closer to the light emitting section 2 and the edge of the underlayer 7 closer to the light emitting section 2 is from about 0.1 to 0.5 mm, for example. An area of the opening in the reflective layer 8 can be between about 0.8 and 2.5 times, preferably between about 1 and 2 times, more preferably between about 1.3 and 1.6 times, of an area of the opening in the underlayer 7.

The reflective layer 8 can be formed from any of the materials for the underlayer 7 mentioned above. In other words, the reflective layer 8 can be formed using, for example, a thermosetting resin, thermoplastic resin, or the like. Furthermore, it is preferable for these resins to contain a light-reflecting material and/or other additives. The reflective layer 8 preferably has the light reflectance of 80% or higher with respect to the light from the light emitting element as well as the light whose wavelength has been converted by wavelength conversion material. It is preferable for the reflective layer 8 to have a higher light reflectance than the underlayer 7. The reflective layer 8 can contain the light-reflecting material and/or other additives in the ratio of from 5 to 70 weight percent to the total weight of the reflective layer 8. The reflective layer 8, however, preferably contains the same materials or have the same composition as the underlayer 7. The light reflectance of the reflective layer 8 mentioned above is preferably higher than that of the underlayer 7. For this purpose, the reflective layer 8 preferably contains a light-reflecting material having a higher light reflectance than that contained in the underlayer 7 and/or contains a larger amount of the light-reflecting material.

By forming the reflective layer 8 on the underlayer 7, the role of protecting the wiring member 13 by ensuring the insulating properties of the flexible substrate 10 and the role of increasing the light extraction efficiency by preventing the light emitted from the light emitting elements 5 from being absorbed by the substrates can be separated. More particularly, with this arrangement, even though the adhesion to the sealing member 6 and the light reflectance of the under layer 7 and the reflective layer may be contrary properties, having the underlayer 7 and the reflective layer 8 play different roles as described above can attain a balance between the adhesion and light reflectance properties.

The thickness of the reflective layer 8 can be suitably set within the ranges discussed in connection to the thickness of the underlayer 7. The thickness of the reflective layer 8 is preferably substantially the same as that of the underlayer 7. The thickness of the reflective layer 8 is more preferably set to achieve enough light reflectance in accordance with the materials, particularly the type and the content of the light-reflecting material, used to compose the reflective layer 8. The reflective layer 8 can be formed separately from the underlayer 7 on one face of the base body 11 by using any of the methods mentioned in connection with the forming method for the underlayer 7.

Reflective Sheet 20

The reflective sheet 20 is provided to reflect the light from the light emitting sections 2 to improve the effectiveness in extracting the light from the light emitting device 1. The reflective sheet 20 is an insulating sheet having light reflectance, and is preferably aflame retardant sheet. The reflective sheet 20 is preferably a film including a synthetic resin, for example, a white polyethylene terephthalate (white PET) or a white glass fiber reinforced epoxy composite.

The size (that is, vertical and horizontal lengths in plan view), and the thickness of the reflective sheet 20 are not particularly limited, as long as it has a large enough area for disposing the flexible substrates 10 at a proper pitch required for the finished product of the light emitting device 1 thereon. Its size can be suitably selected in accordance with the purpose. For example, in the case where the light emitting device is used for a television backlight application, the vertical and horizontal lengths may be several tens of centimeters or larger. In this case, the thickness of the reflective sheet 20 may be in a range between about several tens and several hundreds of micrometers. Any commercially available PET film used as an LCD backlight reflective sheet (for example, the white low specific gravity grade (E6SR) of Lumirror™, 188 μm in thickness, high reflectance type (product number 188) manufactured by Toray Industries, Inc., or the like) can be employed as the reflective sheet 20.

Adhesive Member 30

The adhesive member 30 adheres the flexible substrates 10 and the reflective sheet 20 in the regions where the reflective layer 8 is not formed. The adhesive member 30 preferably has insulating properties, and furthermore, preferably has high flame retardancy. A double-sided tape (pressure sensitive adhesive member) or the like can be preferably used as the adhesive member 30. For example, an acrylic-based double-sided tape manufactured by DIC Corporation (product number 8606TN), or the like can be used. Also, a thermosetting or thermoplastic resin liquid adhesive, or a hot melt adhesive sheet can be also used for the adhesive member 30.

Method for Producing a Light Emitting Device Next, a method for producing the light emitting device 1 will be explained.

Figure 7A:
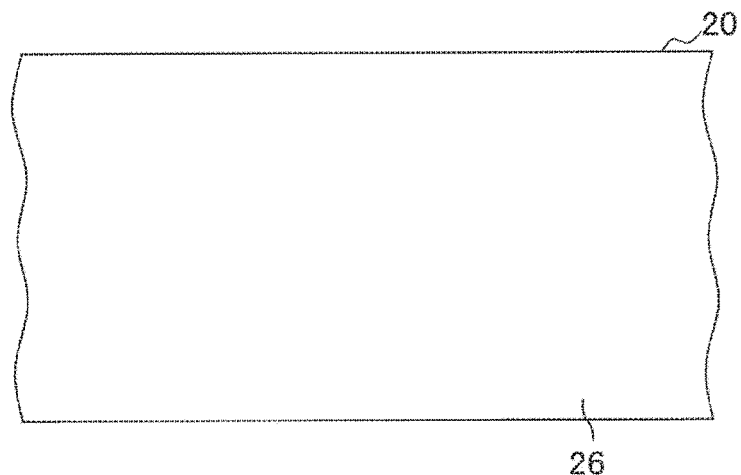
FIG. 7A is a schematic view showing a production step for the light emitting device according to Embodiment 1, which is a plan view of the reflective sheet.

First, as shown in FIG. 7A, a reflective sheet 20 is prepared. The reflective sheet 20 is larger than the outer shape of the light emitting device 1. The reflective sheet 20 in this embodiment is horizontally oblong, having a vertical length that is substantially equivalent to the finished product height of the light emitting device 1.

Figure 7B:
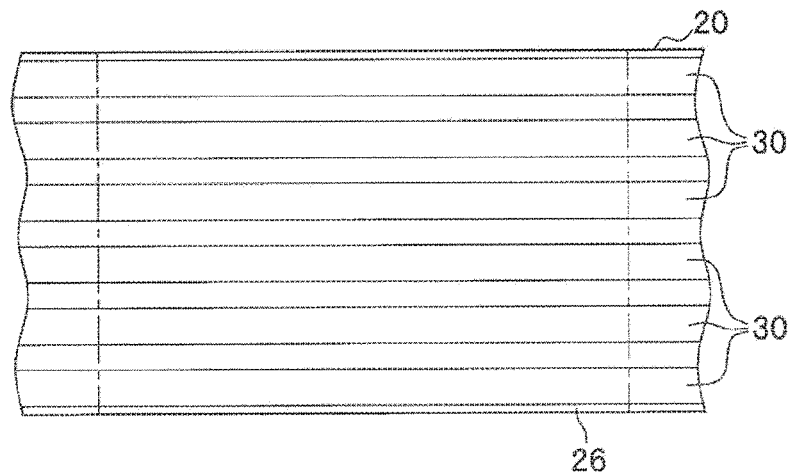
FIG. 7B is a schematic view showing a production step for the light emitting device according to Embodiment 1, which is a bottom view of the reflective sheet to which an adhesive member has been pasted.

Next, as shown in FIG. 7B, adhesive members 30 are disposed on the rear face 26 of the reflective sheet 20. In this embodiment, the adhesive members 30 have a length that is longer than the length of the flexible substrates 10, and substantially the same width as that of the flexible substrates 10. The adhesive members 30 in this embodiment are acrylic-based double-sided tape. A plurality of adhesive members 30 (six shown here) are arranged at a certain pitch in the direction substantially perpendicular to the longitudinal direction of the reflective sheet 20, and disposed on the reflective sheet 20.

Figure 7C:
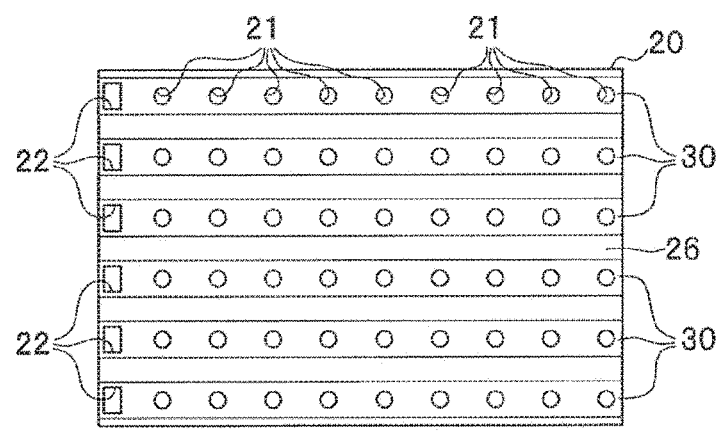
FIG. 7C is a schematic view showing a production step for the light emitting device according to Embodiment 1, which is a plan view of the reflective sheet which has undergone cutting and hole-making machining operations.

Next, as shown in FIG. 7C, through holes 21 and 22 are created in the reflective sheet 20, and the reflective sheet 20 is cut to a width of the finished product (the light emitting device 1). The through holes 21 and 22 are preferably created simultaneously when the reflective sheet 20 is cut to size. Here, the positions of the through holes 21 are matched to the positions of the light emitting sections 2 disposed on the flexible substrates 10 which will be disposed. The positions of the through holes 22 are matched to the positions of the connectors 3 and 4 of the flexible substrates 10. The through holes 21 and 22 are formed so as to penetrate through both the reflective sheet 20 and the adhesive members 30.

Figure 7D:
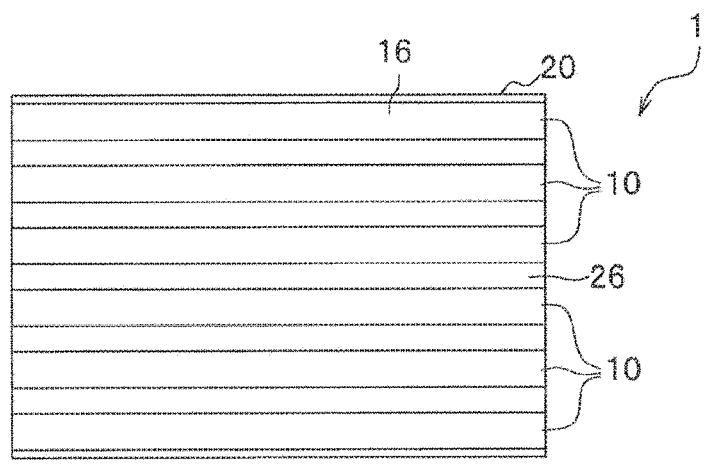
FIG. 7D is a schematic view showing a production step for the light emitting device according to Embodiment 1, which is a bottom view of the reflective sheet to which flexible substrates have been adhered.

Then, as shown in FIG. 7D, the flexible substrates 10 are adhered to the rear face 26 of the reflective sheet 20. The flexible substrates 10 are aligned so that the light emitting sections 2 disposed on the faces of the flexible substrates 10 opposite the back faces 16 are exposed at the through holes 21 of the reflective sheet 20. On the upper face 15 side of the flexible substrates 10, the underlayer 7 at the peripheries of the light emitting sections 2 adheres to the reflective sheet 20 via the adhesive members 30. Also, the flexible substrates 10 are arranged so that the connectors 3 and 4 disposed on each of flexible substrates 10 are all aligned at one side. This can simplify the connection structure between an external power supply and the connectors 3 and 4.

The light emitting device 1 according to this embodiment includes a plurality of flexible substrates 10 lined up at a prescribed pitch and adhered to the reflective sheet 20 having a larger area than the flexible substrates. Thus, the insulating properties of the flexible substrates 10 can be ensured by the reflective sheet 20. Moreover, the light extraction efficiency of the light emitting device 1 can be increased by disposing the reflective sheet 20 and reducing an amount of the light absorbed by the flexible substrates 10.

In the light emitting device 1, moreover, the reflective sheet 20 integrated with the flexible substrates 10 can be deemed as a large device substrate. The light emitting device 1 having such a large area device substrate may not require the use of an insulating white ink, referred to as white resist above, in many regions of reflective sheet 20 where no flexible substrates 10 are adhered, preferably the regions accounting for more than one half of the reflective sheet. Therefore, the amount of insulating white ink used in the light emitting device lean be reduced. Accordingly, a bendable large area light emitting device 1 can be produced inexpensively.

Furthermore, as shown in FIG. 4, the light emitting sections 2 including the light emitting elements 5 mounted on the flexible substrates 10 and covered by the convex sealing member 6 may have light distribution characteristics of high light intensity over a wide angle region as compared to, for example, a light emitting device having a package with a recess for light emitting elements disposed Accordingly, the light emitting device 1 having a two-dimensional array of light emitting sections 2 lined up at certain intervals can be a surface emission light source having a wide light distribution angle, which can be a suitable device for a lighting device, such as a backlight.

Variation of Embodiment 1

Figure 6:
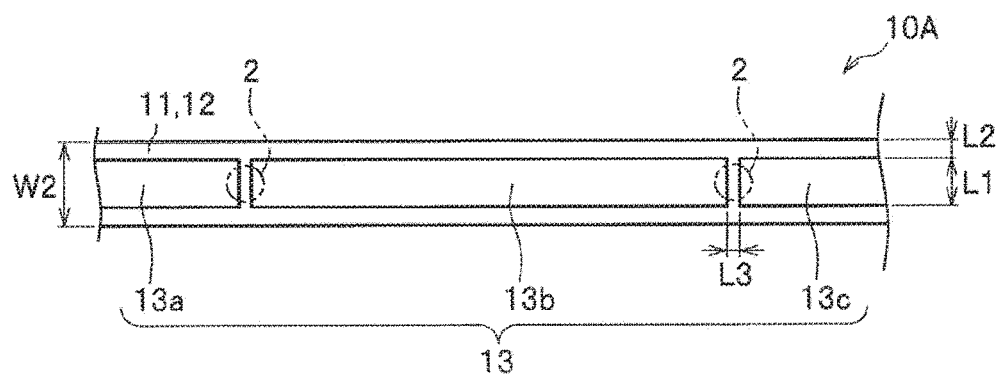
FIG. 6 is a schematic view of the flexible substrate of the light emitting device according to a variation of Embodiment 1, illustrating one example of the wiring member formed under the reflective layer and the underlayer.

As shown in FIG. 6, the light emitting device according to a variation of Embodiment 1 has a differently shaped wiring pattern 13 on the flexible substrate 10A from that of the light emitting device 1 according to Embodiment 1. The flexible substrate 10A has wiring members 13a, 13b, 13c (collectively wiring member 13), which arranged along the longitudinal direction of the flexible substrate 10. Two light emitting sections 2 are disposed between two of these three wiring members 13a, 13b, 13c, respectively. The grooves between the wiring members 13 extend in the direction perpendicular to the longitudinal direction of the flexible substrate 10A. The two adjacent light emitting sections 2 (light emitting elements 5) are disposed so that these electrodes having opposing polarities face to each other in the longitudinal direction of the flexible substrates 10A and connected in series.

As shown in FIG. 6, the width of the flexible substrate 10A is denoted as W2. The width of the wiring members 13 formed in one line in the longitudinal direction of the flexible substrate 10A is denoted as L1, and the creepage distance is denoted as L2. In this case, preferably, the relationship expressed by the following formula (2) is established. The groove width between the wiring members 13a and 13b, and between the wiring members 13b and 13c, is denoted as L3.

$$W9 = L1 + 2 \times L2 \qquad \text{formula (2)}$$

Figure 14:
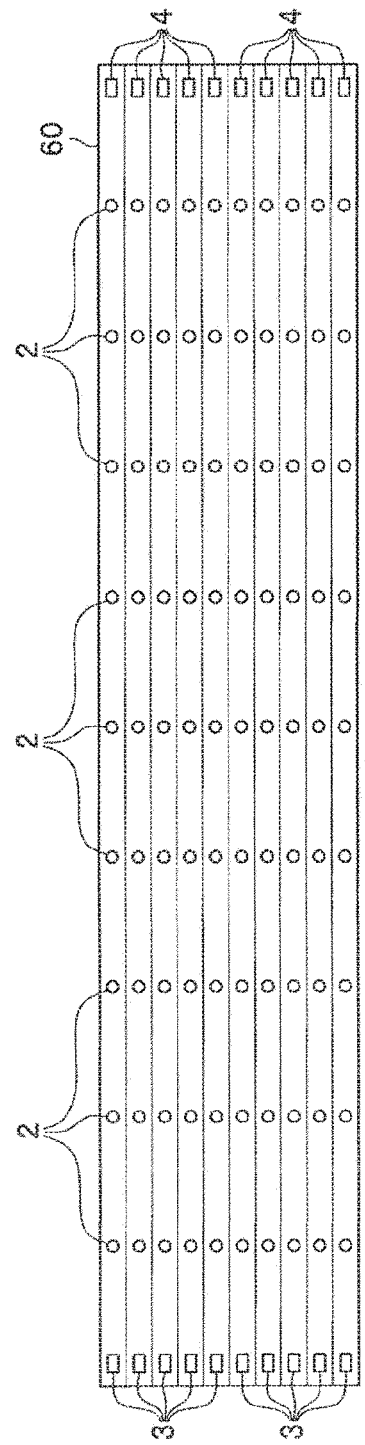
FIG. 14 is a schematic view showing a production step for the light emitting device according to the variation of Embodiment 6, which is a plan view of a collective sheet for the flexible substrates before separating.

Either the connector 3 or 4 in this variation may be placed at the left end, and the other at the right end, of the flexible substrates 10A, as shown FIG. 14. At every groove between the wiring members 13, one piece of light emitting element 5 may be electrically connected to a pair of wiring members 13 interposing the groove (for example, a pair of the wiring members 13a and 13b, a pair of the wiring members 13b and 13c in FIG. 6).

According to this variation, the width W2 of the flexible substrate 10A can be made narrower than the width W1 of the flexible substrate 10. This may reduce the amount of substrate material required and production costs.

Embodiment 2

Figure 8A:
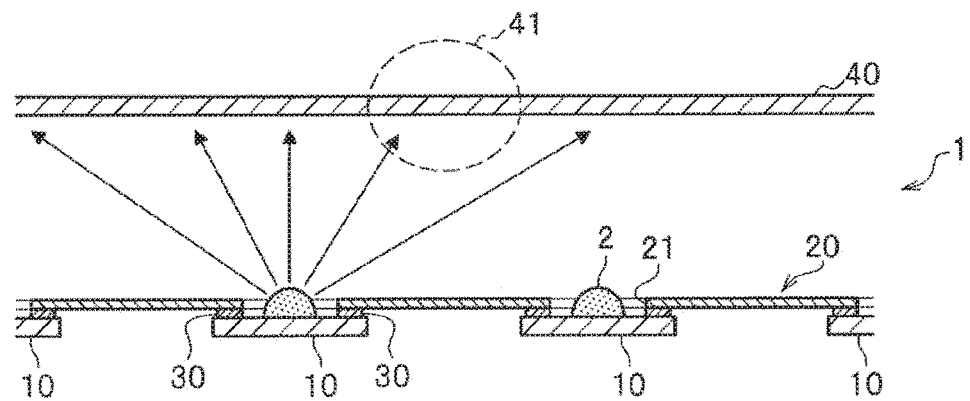
FIG. 8A is a schematic cross-sectional view of a lighting device including the light emitting device according to Embodiment 1.

When the light emitting device 1 is used as a direct-lit type backlight or a lighting device, for example, as shown in FIG. 8A, a light diffuser plate (light irradiation plate) 40, which is installed in front of the light emitting device 1 at a prescribed distance may be used. FIG. 8A schematically shows across section of the light emitting device 1 according to Embodiment 1 cut at the positions of the light emitting sections 2 on the flexible substrates 10 when viewed from the side where the connectors 3 and 4 are located (the left hand side in FIG. 1).

As shown in FIG. 8A, a region 41 of the light diffuser plate 40 substantially equidistant from two adjacent flexible substrates 10 may tend to have lower intensity of light from the light emitting sections 2 of the light emitting device 1.

Figure 8B:
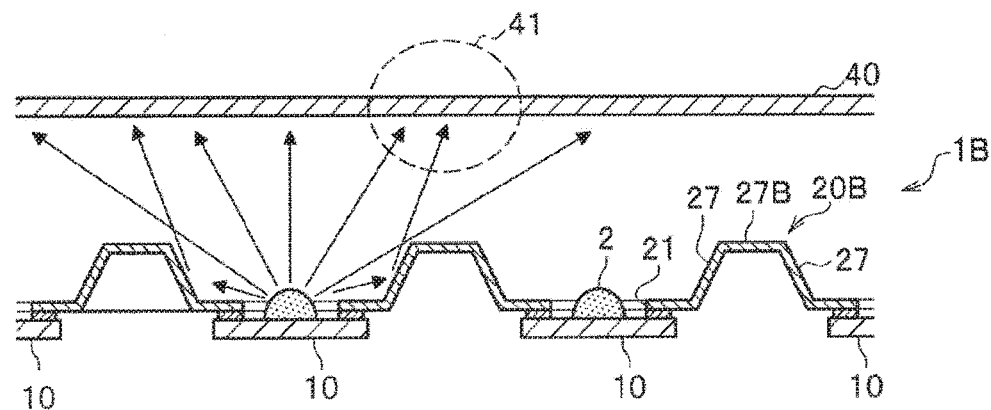
FIG. 8B is a schematic cross-sectional view of a lighting device including the light emitting device according to Embodiment 2.

The light emitting device 1B according to Embodiment 2, as shown in FIG. 8B, differs from the light emitting device 1 according to Embodiment 1 by having a reflective sheet 20B that is three-dimensionally formed. The reflective sheet 20B has through holes 21 as in the case of the reflective sheet 20, but is not flat overall, and has a plurality of three-dimensionally structured sections.

More specifically, the reflective sheet 20B has oblique face portions 27 which extend obliquely so as to spread apart as they become perpendicularly (upwardly) more distant from the light emitting sections 2 of the flexible substrates 10. The oblique face portions 27 shown in FIG. 8B are provided an as to interpose each through hole group comprising the through holes 21 linearly arranged in the longitudinal direction of the flexible substrates 10 from both sides along the longitudinal direction of the flexible substrates 10. The reflective sheet 20B, moreover, has flat portions 27B between two oblique face portions 27 provided in the spaces between two adjacent flexible substrates 10.

The oblique face portions 27 can be formed by bending or vacuum forming the flat reflective sheet 20. The oblique face portions 27 of the reflective sheet 20B provided between the flexible substrates 10 may allow the light emitting device 1B to adjust the distribution of the LED light. In other words, the light transversely emitted from the light emitting sections 2 mounted on the flexible substrates 10 can be directed towards the regions 41 of the light diffuser plate 40 which may tend to have lower intensity of light, efficiently utilizing the light emitted in a direction transverse to the optical axis.

Furthermore, the reflective sheet 20B having the oblique face portions 27 will virtually have increased emission points, that is, portions of the oblique face portion 27 which reflect the light from the light emitting sections 2 can be regarded as additional emission points, thereby allowing the light emitting device 1B to reduce the unevenness of illuminance at the light diffuser plate 40. This can reduce grainy appearance (granular appearance) caused by the so-called spots of light, which are the centers (forward direction) of the light emitting sections 2 where the light intensity is high, occurring especially when the light emitting device 1B is used in a thin direct-lit backlight or lighting device.

A size, angle, and location of the oblique face portions 27 described above can be suitably determined in accordance with the design of the light emitting device 1. For example, assuming that the light intensity of the optical axis direction (0 degree direction) of the light emitting section 2 is 100%, they are preferably set so as to result in light intensity of at least 30% in an 80 degree direction measured from the optical axis of the light emitting section 2.

Figure 8C:
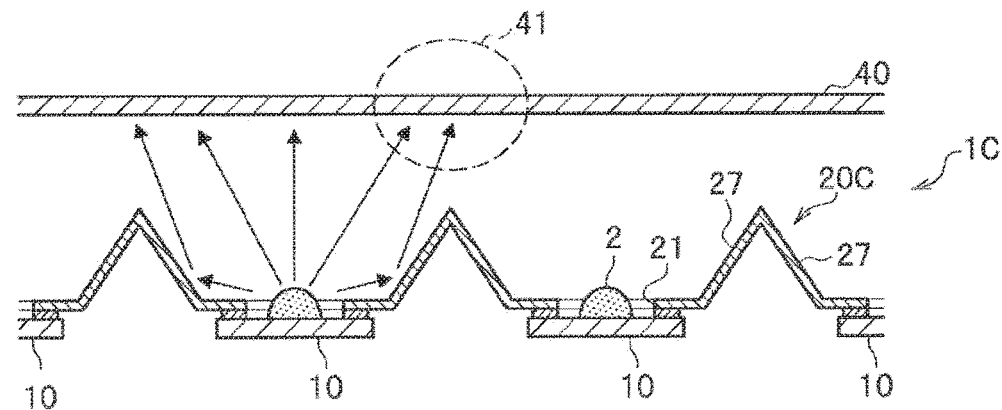
FIG. 8C is a schematic cross-sectional view of a lighting device including the light emitting device according to a variation of Embodiment 2.

The oblique face portions 27 described above can be any shape as long as they can be used as a reflector to reflect the light transversely emitted from the light emitting sections 2 upwardly. For example, as shown in FIG. 8C, they may be configured as in the case of the light emitting device 1C according to a variation of Embodiment 2. In other words, in the light emitting device 1C, the oblique face portions 27 are provided so as to interpose each through hole group consisting of the through holes 21 linearly arranged in the longitudinal direction of the flexible substrates 10 from both sides along the longitudinal direction of the flexible substrates 10, and two oblique face portions 27 located between two adjacent flexible substrates 10 are continuously formed. The light emitting device 1C, as in the case of the light emitting device 1B, can efficiently utilize the light emitted in the direction transverse to the optical axis, and reduce the unevenness of illuminance at the light diffuser plate 40.

In the above-described light emitting devices 1B and 1C, the oblique face portions 27 are disposed so as to reflect the light emitted from a plurality of light emitting sections 2 disposed in a row on each of the flexible substrates 10. Alternatively, the oblique face portions may be disposed to reflect the light from individual light emitting sections 2. More specifically, the light emitting device may include a reflective sheet having a ring-shaped oblique face portion provided so as to surround at the periphery of each light emitting section 2. In other words, each oblique face portion may extend obliquely so as to spread out from the rim of each through hole 21 of the reflective sheet 20 as it becomes perpendicularly more distant from the face of the flexible substrate 10 on which the light emitting sections 2 are disposed.

Embodiment 3

Figure 9:
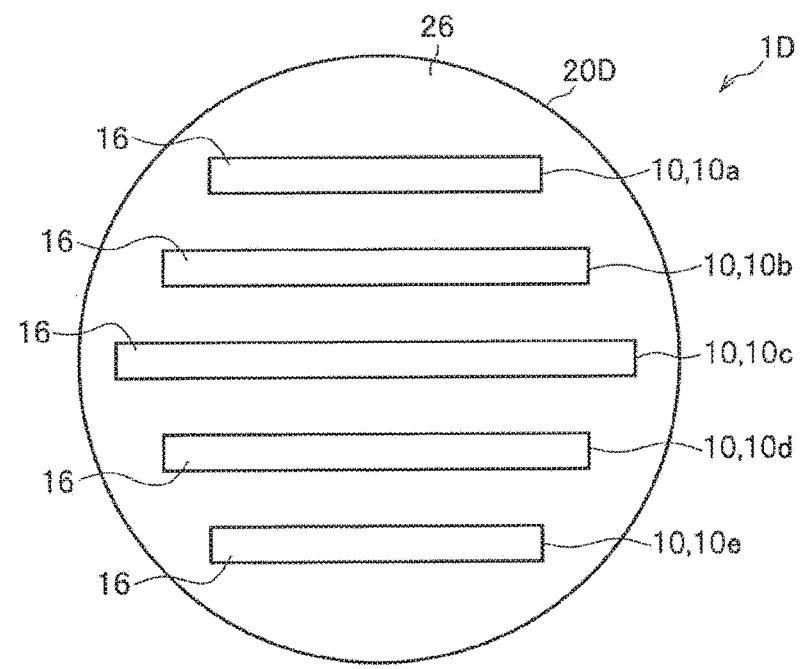
FIG. 9 is a schematic bottom view of the light emitting device according to Embodiment 3.

As shown in FIG. 9, the light emitting device 1D according to Embodiment 3 differs from the light emitting device 1 according to Embodiment 1 by having a reflective sheet 20D that having a circular shape in plan view. In the light emitting device 1D, a plurality of flexible substrates 10 (five shown here—10a, 10b, 10c, 10d, and 10e) are adhered to the rear face 26 of the reflective sheet 20D in a stripe pattern at a pitch. The flexible substrate 10c located in the center of the reflective sheet 20D is set to the largest length, the flexible substrates 10a and 10e located near the edge are set to the smallest length, and the flexible substrates 10b and 10d positioned in between are set to the middle length.

The light emitting device 1D can be produced in similar process to in the case of the light emitting device 1, such as creating through holes 21 and 22 in an unprocessed reflective sheet 20 in alignment with the positions of the light emitting sections 2 and connectors 3 and 4, respectively, of the flexible substrates 10, and achieving the reflective sheet 20D by cutting in accordance with the finished product shape of the light emitting device 1D (that is, a circular shape).

Embodiment 4

Another embodiment having a different reflective sheet shape will be explained next.

Figure 10:
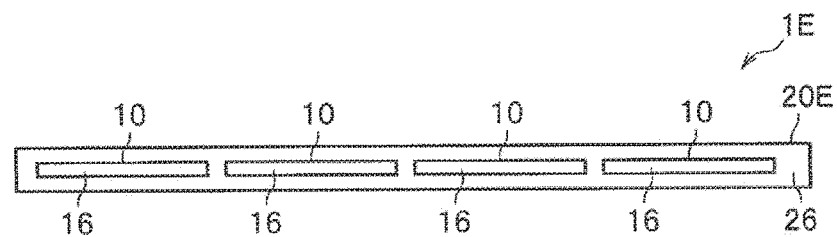
FIG. 10 is a schematic bottom view of the light emitting device according to Embodiment 4.

As shown in FIG. 10, the light emitting device 1E according to Embodiment 4 differs from the light emitting device 1 according to Embodiment 1 by having a narrow line shape reflective sheet 20E. In the light emitting device 1E, a plurality of flexible substrates 10 (four shown here) are arranged linearly along the longitudinal direction of the flexible substrates 10 at a prescribed pitch, and adhered to the rear face 26 of the reflective sheet 20E.

The light emitting device 1E can be produced in similar process to in the case of the light emitting device 1, such as creating through holes 21 and 22 in an unprocessed reflective sheet 20 in alignment with the positions of the light emitting sections 2 and connectors 3 and 4, respectively, of the flexible substrates 10, and achieving the reflective sheet 20E by cutting in accordance with the finished product shape of the light emitting device 1E.

Embodiment 5

Figure 11A:
FIG. 11A is a schematic plan view of the reflective sheet used in the light emitting device according to Embodiment 5.
Figure 11B:
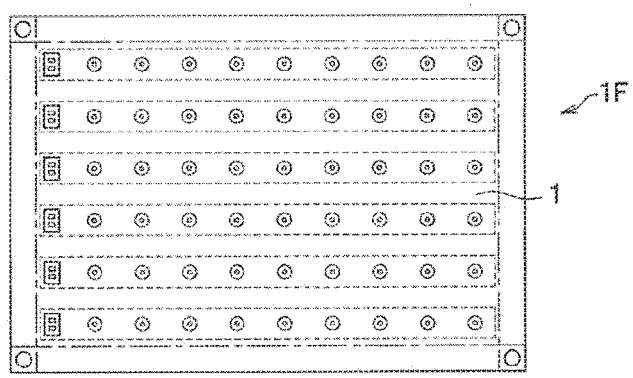
FIG. 11B is a schematic plan view of the light emitting device according to Embodiment 5.

In the case where the light emitting device 1 according to Embodiment 1 is used in a backlight for a television, for example, the vertical and horizontal lengths of the light emitting device 1, i.e., the vertical and horizontal lengths of the reflective sheet 20, may be at least several tens of centimeters, exceeding one meter in some cases. A packaging cost required for the light emitting device 1 tends to easily increase as the area of the light emitting device 1, or the reflective sheet 20, increases. For reducing the packaging cost, the light emitting device 1F according to Embodiment 5, as shown in FIGS. 11A and 11B, differs from the light emitting device 1 according to Embodiment 1 by having a reflective sheet 20F which is provided with ancillary sections 28 for packaging purposes.

The ancillary sections 28 are provided at the periphery of the part that actually functions as the light emitting device 1. For this purpose, the reflective sheet 20F is formed in a slightly larger size than that of the reflective sheet 20 of the light emitting device 1 according to Embodiment 1. The reflective sheet 20F includes the reflective sheet 20 of the light emitting device 1 in the center, and has the ancillary sections 28 at the four sides of the rectangle reflective sheet 20 provided along cutting guide lines 28L by providing cut off lines like broken-line in the reflective sheet 20F for separating the reflective sheet 20 and the ancillary section 28 later. Here, the ancillary sections 28 are configured as four roughly narrow rectangular parts along the cutoff lines 28L, and through holes 29 are created at four corners.

The process for producing the light emitting device 1F differs from that for the light emitting device 1 such that a reflective sheet larger than the outer shape of the light emitting device 1 is prepared, which is cut to size after providing cutting guide lines 28L along the outer edge of the light emitting device 1 while reserving the ancillary sections 28. Also, the process for producing the light emitting device 1F including creating through holes 21 and 22 in alignment with the positions of the light emitting sections 2 and the connectors 3 and 4, respectively, of the flexible substrates 10, and achieving the reflective sheet 20F by cutting in accordance with the finished product shape of the light emitting device 1F including the ancillary sections 28. The light emitting device 1F can otherwise be produced in similar manner to in the case of the light emitting device 1. The through holes 29 in the ancillary sections 28 at four corners of the reflective sheet 20 may be formed as needed. The through holes 29 can be created at the same time the through holes 21 and 22 are created.

Figure 11C:
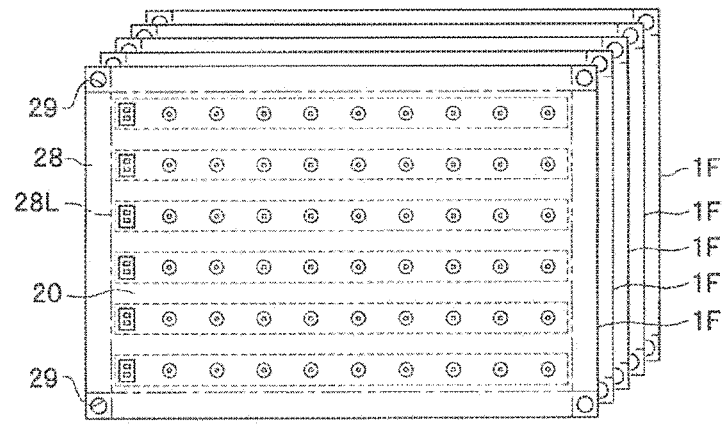
FIG. 11C is a schematic exploded perspective view showing a stack of a plurality of light emitting devices according to Embodiment 5.

In packaging the light emitting devices 1F, as shown in FIG. 11C, the products (light emitting devices 1F) are stacked, and, for example, stapled together at several locations in the ancillary sections 28 so that the light emitting devices 1F may not shift. In the cases where through holes 29 are provided in the ancillary sections 28, the light emitting devices 1F can be bundled using strings fed through the holes 29 so they may not shift. These light emitting devices 1F may be then placed in a corrugated cardboard box, for example. An insulating film may be laid over the outermost surface of the stacked products.

Since the products (light emitting devices 1F) are held together using the ancillary sections 28, shifting during transportation can be reduced, which can reduce the occurrences of scratches attributable to shifting of the products.

Following the transportation, the light emitting devices 1F may be unpacked, removed the ancillary sections 28 along the cutting guide lines 28L of the products (light emitting devices 1F), and used as the regular light emitting devices 1 by users. In the case where light emitting devices are packed in a corrugated cardboard box, breaking or chipping at the edges of the light emitting devices may occur. In the case of the light emitting device 1F, however, the ancillary sections 28 which are the edges of the products and tend to be damaged can be removed.

As explained above, according to the light emitting device 1F, even using simple packaging way such as stacking and placing the products (light emitting devices 1F) in a corrugated cardboard box, (1) breaking and chipping of the edges of the product can be reduced by removing the ancillary sections 28, and (2) the occurrences of scratches can be reduced by reducing the products from shifting during transportation.

By simplifying the packaging, the cost required for packaging can be reduced even for a large area light emitting device 1 therefore the price of the light emitting device can be reduced.

Embodiment 6

As shown in FIG. 12, the light emitting device 1G according to Embodiment 6 differs from the light emitting device 1 according to Embodiment such that the flexible substrates 10 are laminated with the reflective sheet 20 disposed on the upper face 15 side and the insulating sheet 50 disposed on the back face 16 side. The insulating sheet 50 is continuously adhered to the faces of the flexible substrates 10 opposite the upper faces 15 where the light emitting sections 2 are disposed (i.e., the back faces 16), and the same face of the reflective sheet 20 (the rear face 26) as that adhering to the flexible substrates 10.

The insulating sheet 50 is preferably made of a synthetic resin, such as polyethylene terephthalate (PET), or the like, a metal sheet with insulating coating, or a metal sheet laminated with a synthetic resin film, such as PET. The insulating sheet 50 is formed larger than the flexible substrates 10, and when using a single insulating sheet 50, it preferably has substantially the same size as that of the reflective sheet 20. The thickness of the insulating sheet 50 can be the same thickness as that of the reflective sheet 20 in the case of the material of insulating sheet 50 is synthetic resin like PET. A plurality of insulating sheets that are smaller in size than the reflective sheet 20 can be used in the light emitting device 1G instead of one insulating sheet 50.

The light emitting device 1G can be produced by further performing a step of providing the insulating sheet 50 following the production of the light emitting device 1. More specifically, as shown in FIG. 7D, the light emitting device 1 where the flexible substrates 10 are adhered on the rear face 26 of the reflective sheet 20 is prepared in advance. An adhesive member 30G, such as a double-sided tape, is provided on one face of the insulating sheet 50 in advance. By adhered that face of the insulating sheet 50 to the rear face 26 of the reflective sheet 20 with the adhesive member 30G, the light emitting device 1G can be produced. Alternatively, the adhesive member 30G may be provided on the rear face 26 of the reflective sheet 20 first, followed by bonding the insulating sheet 50 to the adhesive member 30G. A size, shape, and the quantity of the adhesive member 30G may be suitably set. According to the light emitting device 1G, the strength can be increased.

Variation of Embodiment 6

The creepage distance as shown in FIGS. 5 and 6 is normally required in order to ensure the insulating properties of the flexible substrate 10 and 10a. In the case where the creepage distances is eliminated by making an edge of the wiring pattern 13 and an edge of the base body 11 of the flexible substrates 10 or 10A substantially identical in a plan view, aside face of the wiring member 13 will be bare on the edge of the flexible substrate 10 or 10A, which may raise a concern caused by static electricity when handling the flexible substrates 10. In the light emitting device 1G according to Embodiment 6, however, the flexible substrates 10 are laminated with the reflective sheet 20 and the insulating sheet 50, and thus the side faces of the wiring member 13 on the flexible substrates 10 will not be bare. Thus, the flexible substrates 10 can be protected against static electricity during the handling of the light emitting device 1 with the flexible substrates 10, and insulating properties in the creepage direction can be ensured at low cost by pasting the insulating sheet 50 to the back faces 16 of the flexible substrates 10.

Figure 13:
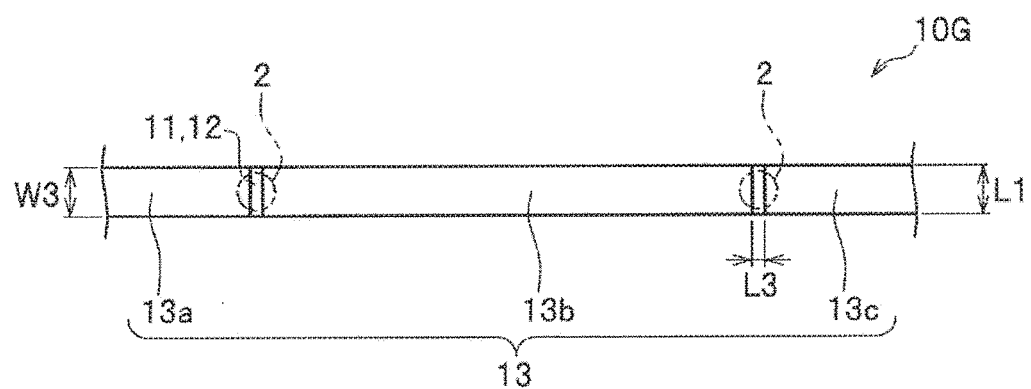
FIG. 13 is a schematic plan view of a flexible substrate of the light emitting device according to a variation of Embodiment 6, showing an example of the wiring pattern formed under the reflective layer and the underlayer.

In a variation of Embodiment 6, as shown in FIG. 13, the flexible substrate 10G has no creepage distances. As shown in FIG. 13, the width of the flexible substrate 10G is denoted as W3. The width of the wiring pattern 13 formed along a line in the longitudinal direction of the flexible substrate 10G is denoted as L1, and the creepage distance is 0. In this case, the relationship expressed by the following formula (3) is established. The groove width between the wiring members 13a, 13b, 13c is denoted as L3.

$$W3=L1 \qquad \text{formula (3)}$$

The flexible substrate 10G shown in FIG. 13 can be produced by preparing a flexible substrate collective sheet 60 shown in FIG. 14, followed by separating them, for example. The collective sheet 60 shown here corresponds to ten flexible substrates. On each substrate, the connector 3 is disposed at the left end, and the connector 4 is disposed at the right end. In the collective sheet 60, the width of each of these ten flexible substrates, which will be used as the flexible substrates 10G later is preset to the width W3 shown in FIG. 13, i.e., the width L1 of the wiring pattern 13, unlike the flexible substrates 10A.

By producing a collective sheet 60 designed as above, the width W3 of the flexible substrates 10G described above can be reduced, for example, to a 60% value of the width W2 of the flexible substrate 10A shown in FIG. 6. The elimination of the creepage distances in this way can reduce the areas of flexible substrates 10G, and thus can reduce the production costs of the flexible substrates 10G.

Embodiment 7

Figure 15:
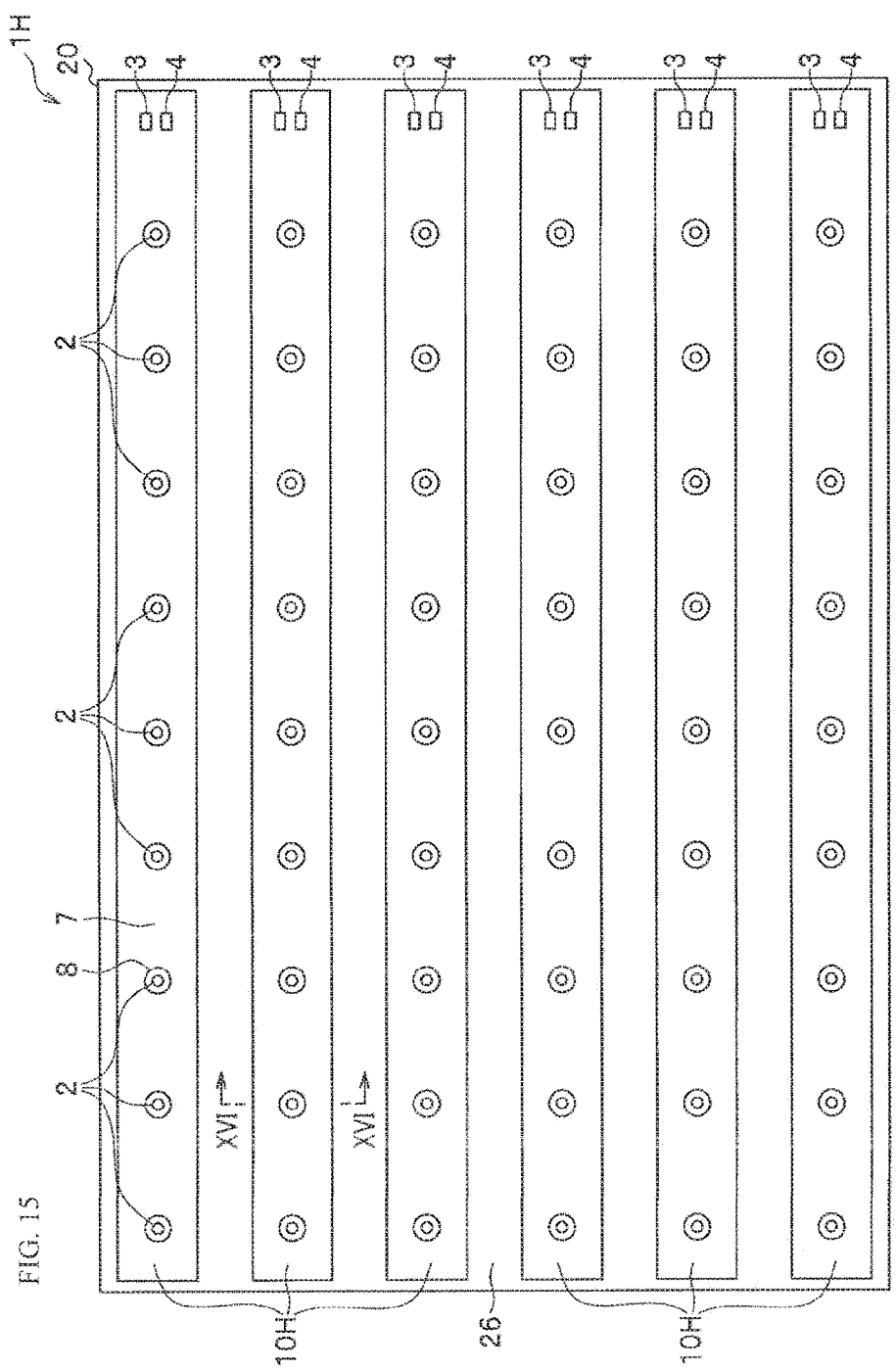
FIG. 15 is a schematic view of the light emitting device according to Embodiment 7, which is a plan view of the reflective sheet viewed from the rear face side.
Figure 16:
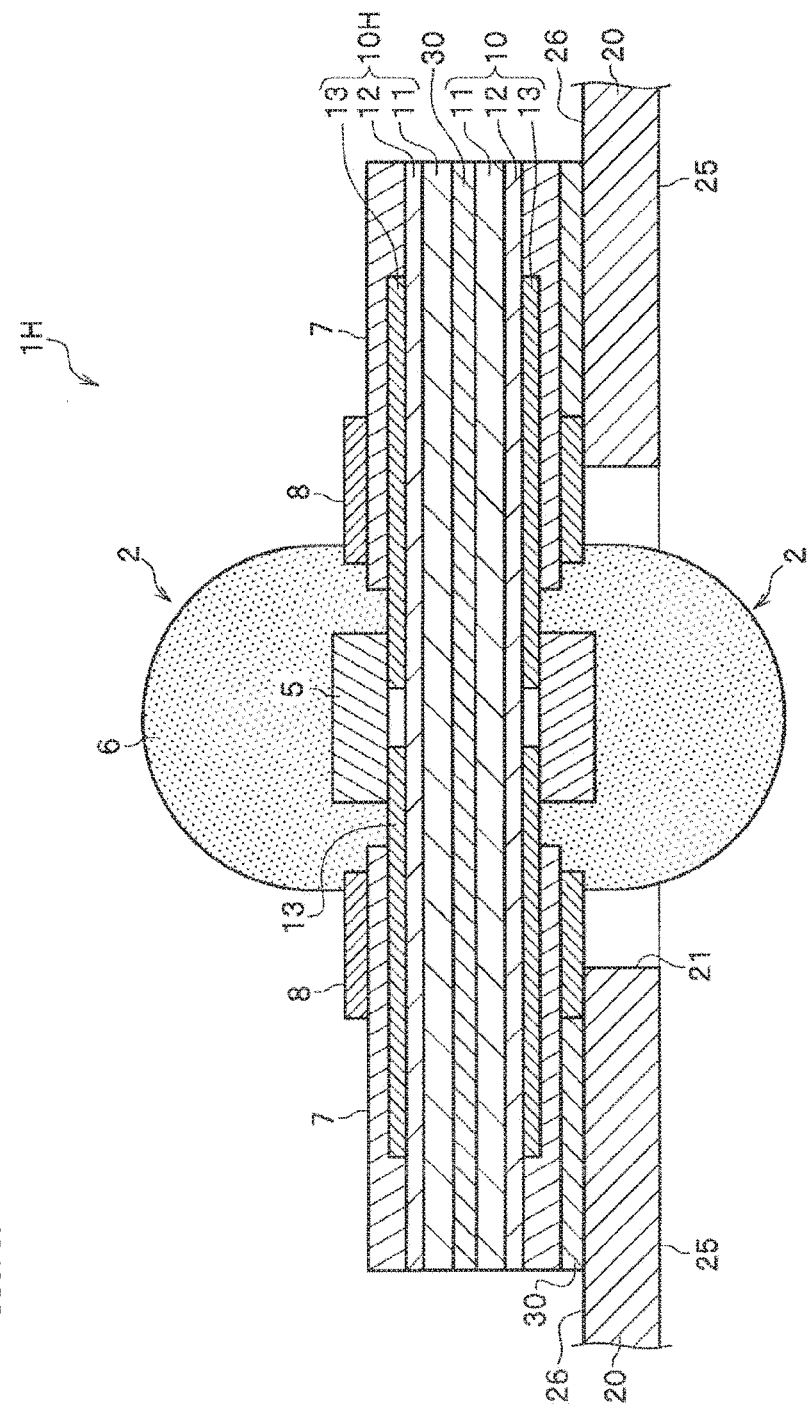
FIG. 16 is a schematic view of the light emitting device according to Embodiment 7, which is an enlarged cross section viewed in the direction indicated by arrows XVI-XVI in FIG. 15.

As shown in FIGS. 15 and 16, the light emitting device 1H according to Embodiment 7 differs from the light emitting device 1 according to Embodiment 1 such that it is a double-side emitting type light emitting device where light can be emitted from the rear face side. The light emitting device 1H can produced by adhering the flexible substrates 10 to the flexible substrates 10H via the adhesive member 30. The light emitting device 1H can emit the light from the light emitting sections 2 to both the front and rear faces side of the light emitting device 1H. The flexible substrates 10H here have similar configuration as that of the flexible substrates 10.

The light emitting device 1H can be produced by further performing a step of bonding the flexible substrates 10H after producing a light emitting device 1. For example, the light emitting device 1 in which the flexible substrates 10 are bonded on the rear face 26 of the reflective sheet 20, as shown in FIG. 7D, is prepared in advance. A collective sheet of the flexible substrates 10H is prepared in advance, and the adhesive member 30, such as a double-sided tape, for example, is provided on the rear face of the collective sheet. The light emitting device 1H can be produced by bonding the back faces of the flexible substrates 10H, which have been separated from the collective sheet, to the back faces 16 of the flexible substrates 10 on the reflective sheet 20. Alternatively, the adhesive member 30 may be first provided on the back faces 16 of the flexible substrates 10 on the reflective sheet 20, followed by bonding the flexible substrates 10H to the adhesive member 30.

According to the light emitting device 1H, a flexible double-sided emission type light emitting device can be produced at low cost. The light emitting device 1H, being a double-sided emission type, can be applied to, for example, a double-sided internally illuminated signboard where both the front and rear faces are signboard faces illuminated by a light emitting device installed inside.

Embodiment 8

Figure 17:
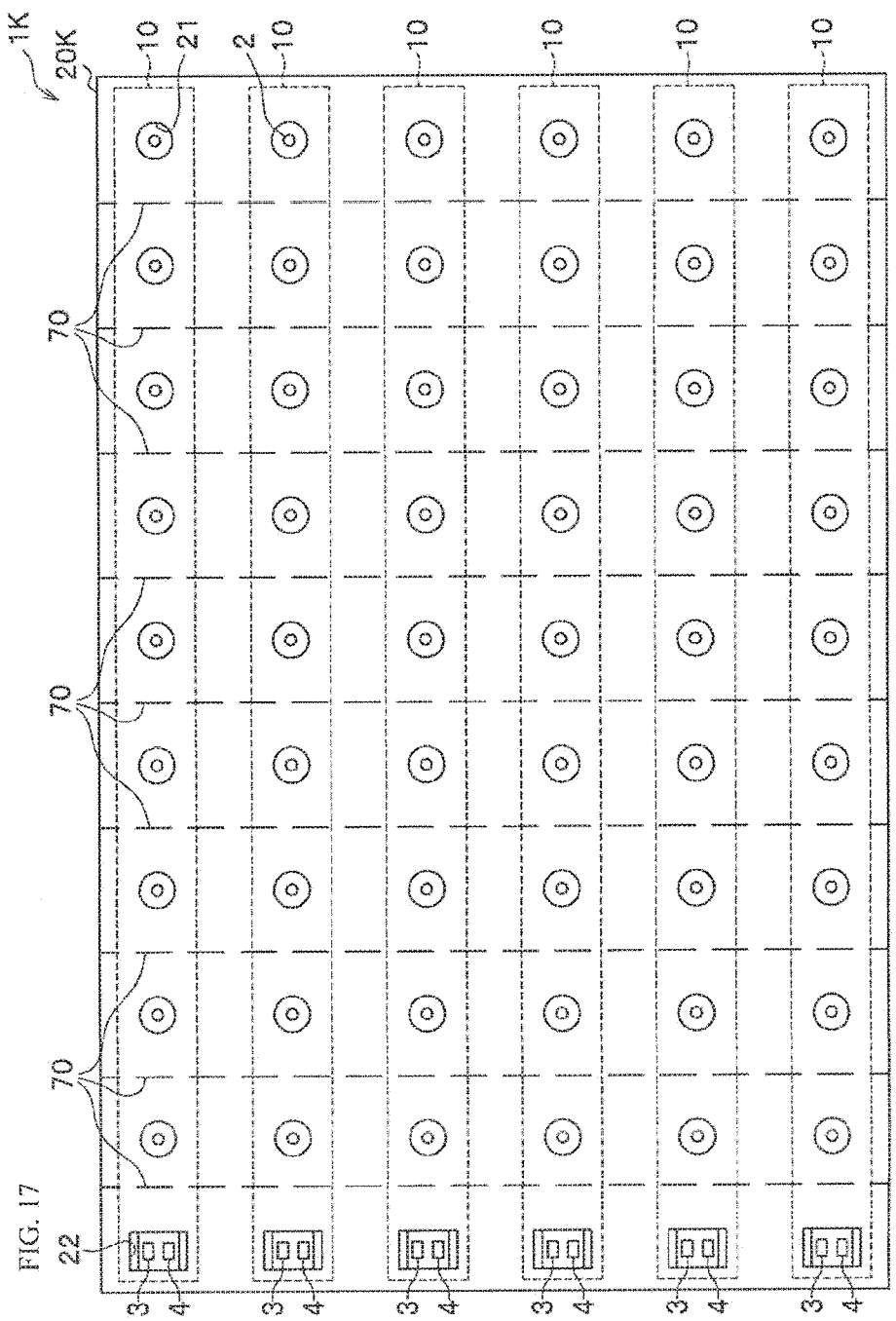
FIG. 17 is a schematic plan view of the light emitting device according to Embodiment 8.

The light emitting devices according to the embodiments preferably further include a feature to reduce warping that can be caused by, for example, temperature and/or humidity. As shown in FIG. 17, the light emitting device 1K according to Embodiment 8 differs from the light emitting device 1 according to Embodiment 1 by having a reflective sheet 20K provided with broken-line shaped slits 70. The slits 70 are provided to reduce warping resulting from, for example, temperature and/or humidity. The slits 70 are created in the direction substantially perpendicular to the upper face of the flexible substrates 10 by perforating. A plurality of slits 70 are created at positions that deviate from the light emitting sections 2 of the flexible substrates 10.

As for the slits, the distance between them, and the length and width of, the holes (that is, slits 70) can be suitably selected depending on the strength required of the light emitting device 1K and within the ranges that can ensure the insulating properties of the flexible substrates 10, for example. The slits are preferably provided next to the light emitting sections 2 of the flexible substrates 10. The slits may be formed at mid position between two adjacent light emitting sections 2 located on flexible substrates 10, or a position that deviate from mid position. Moreover, multiple slits may be created between two adjacent light emitting sections 2 of the flexible substrates 10. The number of slits is can be suitably selected. The sizes of the slits 70 may be common to all or different. The spacing between the slits may be common to all or different.

In producing the light emitting device 1K, a step of perforating the unprocessed reflective sheet 20 is additionally performed prior to disposing the adhesive member 30 on the reflective sheet 20. More specifically, in the case where the reflective sheet 20 is prepared as shown in FIG. 7A, multiple slits are vertically formed while avoiding the positions of the light emitting sections 2 on the flexible substrates 10. Thereafter, the device can be produced in the same manner as in the case of the light emitting device 1.

In the case where the respective materials mentioned earlier are used for the reflective sheet 20K and the flexible substrates 10 of the light emitting device 1K, the reflective sheet 20K will have a higher rate of heat shrinkage than the flexible substrates 10. For example, under constant temperature and constant humidity conditions, a member which the two materials having different rates of heat shrinkage and coefficients of thermal expansion are bonded tends to reveal different dimensional changes between the two bonded materials, which may cause warping of the member. However, the light emitting device 1K employs the reflective sheet 20K provided with the slits 70, and thus warping can be reduced as the gaps formed by the slits 70 expand when the reflective sheet 20K shrinks due to temperature and/or humidity. According to the light emitting device 1K, therefore, warping can be effectively reduced even when the device is placed, for example, in a high-temperature and high-humidity location, or is heated or dried.

Other Variations

In each of the embodiments discussed above, the reflective layer 8 formed on the flexible substrates 10 are disposed spaced apart from the wiring pattern in the stacking direction by interposing the underlayer 7. However, the underlayer 7 may not be disposed immediately below the reflective layer 8, and the reflective layer 8 may be disposed directly on the wiring pattern.

Furthermore, the underlayer 7 may not be used, as each of the light emitting devices according to the above embodiments can ensure the insulating properties of the flexible substrates 10 using the reflective sheet 20. In this case, the production costs of a large area light emitting device can be further reduced.

In the light emitting devices according to the embodiments discussed above, the connectors 3 and 4 on the flexible substrates 10 are connected to an external power supply using a wire harness. However, a relay board provided with a wiring pattern can be directly connected to the wiring member 13 by soldering, without using the connectors 3 and 4. The relay board may be a general circuit board, but is preferably an oblong flexible substrate. Such a construction requires no wire harnesses or connectors, and thus can reduce materials costs. This increases the cost reduction effect particularly in the case where a large number of flexible substrates are used.

INDUSTRIAL APPLICABILITY

The light emitting devices according to the embodiments described in this disclosure can be used as various types of light sources applicable to lighting fixtures, various indicators, automotive lights, displays, liquid crystal display backlights, sensors, traffic signals, automotive parts, signboard channel letters, and the like.

What is claimed is:

1. A light emitting device comprising:
a plurality of oblong flexible substrates, each flexible substrate comprising a sheet-shaped base body and a wiring pattern formed on one face of the base body, and each flexible substrate having a plurality of light emitting sections disposed thereon;
a plurality of a reflective layers, each reflective layer being disposed at a periphery of a respective light emitting section above a respective flexible substrate;
an insulating reflective sheet made of a light reflecting resin, the reflective sheet having a plurality of through holes located such that the light emitting sections and at least a portion of the reflective layers are exposed via the through holes; and
a plurality of adhesive members, each adhesive member adhering a respective flexible substrate to the reflective sheet in regions where the reflective layer is not formed.

2. The light emitting device according to claim 1, further comprising an underlayer disposed on a portion of each of the flexible substrates, wherein at least a portion of each underlayer is interposed between each flexible substrate and each respective reflective layer.

3. The light emitting device according to claim 2, wherein each of the flexible substrates includes a region where the base body and the wiring pattern are stacked in that order, and
wherein at least one of the flexible substrates includes, in an area above the wiring pattern, a region where the underlayer and the reflective layer are stacked on the wiring pattern, and a second region where the underlayer is stacked on the wiring pattern but exposed from the reflective layer.

4. The light emitting device according to claim 1, wherein the flexible substrates are lined up in a direction substantially perpendicular to a longitudinal direction of the flexible substrates.

5. The light emitting device according to claim 1, wherein the flexible substrates are linearly arranged along a longitudinal direction of the flexible substrates.

6. The light emitting device according to claim 1, wherein the reflective sheet has oblique face portions extending obliquely from portions of the reflective sheet that are adhered to the flexible substrates so as to spread apart from one another as they become more distant from the light emitting sections of the flexible substrates, the oblique face portions being disposed so as to interpose and extend along groups of through holes that are linearly arranged in longitudinal directions of the flexible substrates.

7. The light emitting device according to claim 1, wherein the reflective sheet has an oblique face portion for each of the through holes extending obliquely from a portion of the reflective sheet that is adhered to each flexible substrate so as to spread apart from the rim of the through hole as it becomes more distant from the light emitting sections of the flexible substrates.

8. The light emitting device according to claim 1, wherein the light emitting sections have a plurality of light emitting elements that are electrically connected to the wiring pattern via electrodes of the light emitting elements, the flexible substrates have a single row of wiring members extending between at least two adjacent light emitting elements, and the at least two adjacent light emitting elements are disposed and connected in series so that electrodes of opposing polarities face one another.

9. The light emitting device according to claim 1, further comprising an insulating sheet continuously adhered to the faces of the flexible substrates opposite the faces on which the light emitting sections are disposed, and to the same face of the reflective sheet as that adhered to the flexible substrates.

10. The light emitting device according to claim 1, wherein (i) faces of the flexible substrates bonded to the reflective sheet that are opposite faces on which light emitting sections of the flexible substrates are disposed, are adhered to (ii) faces of a plurality of other flexible substrates opposite faces on which light emitting sections of the other flexible substrates are disposed.

11. The light emitting device according to claim 1, wherein the reflective sheet has slits extending in a direction substantially perpendicular to a longitudinal direction of the flexible substrates, a plurality of the slits being located at positions that deviate from the light emitting sections of the flexible substrates.

12. The light emitting device according to claim 1, wherein a part of each of the reflective layers overlaps with the reflective sheet.

13. The light emitting device according to claim 1, further comprising a plurality of underlayers, each underlayer being located under a corresponding one of the reflective layers.

14. The light emitting device according to claim 13, wherein:
   each light emitting section comprises a light emitting element, and
   an upper face of each underlayer is at lower than an upper face of each corresponding light emitting element.

15. The light emitting device according to claim 13, wherein:
   each light emitting section comprises a light emitting element, and
   a distance between each reflective layer and each corresponding light emitting element is greater than a distance between each underlayer and each corresponding light emitting element.

16. The light emitting device according to claim 1, wherein the reflective layers are separated from one another based on a configuration of the light emitting sections.

17. The light emitting device according to claim 1, wherein the reflective layers are separated from one another based on a number of light emitting sections.

* * * * *